(12) United States Patent
Takei

(10) Patent No.: US 8,581,273 B2
(45) Date of Patent: Nov. 12, 2013

(54) ORGANIC EL DEVICE

(75) Inventor: Shuichi Takei, Shimosuwa-machi (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 13/470,565

(22) Filed: May 14, 2012

(65) Prior Publication Data

US 2012/0305952 A1    Dec. 6, 2012

(30) Foreign Application Priority Data

May 31, 2011    (JP) .................................. 2011-122157

(51) Int. Cl.
*H01L 51/52*    (2006.01)

(52) U.S. Cl.
USPC ........................ 257/89; 257/40; 257/E51.022

(58) Field of Classification Search
USPC ...................................... 257/E51.022, 40, 89
See application file for complete search history.

(56) References Cited

U.S. PATENT DOCUMENTS

| | | | |
|---|---|---|---|
| 6,863,961 B2 | 3/2005 | Miyashita et al. | |
| 7,224,115 B2 | 5/2007 | Sato et al. | |
| 7,514,115 B2 | 4/2009 | Takashima et al. | |
| 8,183,069 B2 * | 5/2012 | Jung | 438/29 |
| 2008/0176100 A1 | 7/2008 | Uetake et al. | |
| 2010/0127248 A1 * | 5/2010 | Ito | 257/40 |

FOREIGN PATENT DOCUMENTS

| | | |
|---|---|---|
| JP | A-10-153967 | 6/1998 |
| JP | A-2000-208254 | 7/2000 |
| JP | A-2004-207217 | 7/2004 |
| JP | A-2005-85604 | 3/2005 |
| JP | A-2008-174816 | 7/2008 |
| JP | A-2009-283304 | 12/2009 |
| JP | A-2010-232269 | 10/2010 |

* cited by examiner

*Primary Examiner* — Zandra Smith
*Assistant Examiner* — Paul Patton
(74) *Attorney, Agent, or Firm* — Oliff & Berridge, PLC

(57) ABSTRACT

An organic EL device includes: a bank provided to surround a first anode (second anode) on a substrate; a red emission layer (green emission layer) provided at an opening portion of the bank; a third anode having the same polarity as that of the first anode provided on the bank; a blue emission layer provided at an entire portion of the substrate including the third anode; and a cathode having a different polarity from those of the first anode and the third anode provided to cover the blue emission layer.

8 Claims, 7 Drawing Sheets

ORGANIC EL DEVICE

BACKGROUND

1. Technical Field

The present invention relates to an organic EL device including a coating film and a deposition film.

2. Related Art

The organic EL (electroluminescence) device has a structure in which a function layer such as an emission layer is inserted between an anode and a cathode. As a method of manufacturing an organic EL device, for example, as disclosed in JP-A-2000-208254, a bank (partition) is formed surrounding an anode installed on a substrate. Next, a function liquid including an organic film formation material is coated in an opening hole (emission region) surrounded by the bank using an ink-jet method or the like, and then is dried to form a function film.

Further, as disclosed in JP-A-10-153967, so as to improve a blue (B) emission layer of red (R), green (G), and blue (B) emission layers, an approach forming organic emission layers of the R and G by a coating method and forming an inorganic emission layer of B by a deposition method has been used.

However, in the methods described in JP-A-2000-208254 and JP-A-10-153967, only the region surrounded in the bank emits light, it is preferred that the emission area of B is increased further to improve an emission life by reducing luminance of B.

SUMMARY

The invention can be realized in the following forms or application examples.

Application Example 1

An organic EL device according to an application example 1 includes: a partition provided surrounding a first electrode on a substrate; a first emission layer provided at an opening portion of the partition; a second electrode having the same polarity as that of the first electrode provided on the partition; a second emission layer provided on the entirety of the substrate including the second electrode; and a third electrode having a different polarity from those of the first electrode and the second electrode provided to cover the second emission layer.

According to the configuration, since the second electrode, the second emission layer, and the third electrode are provided on the partition, in comparison with a case where light is emitted from only a region of an opening portion having almost the same area as that surrounded by the bank in the related art, it becomes possible to emit light from regions other than the opening portion to increase an emission area. Accordingly, the luminance of a unit area by a second emission layer may be reduced corresponding to an increased emission area in comparison with the related art to improve the life duration of the second emission layer in comparison with the related art.

Application Example 2

In the organic EL device according to the application example, it is preferable that the first emission layer be configured by a coating film and the second emission layer be configured by a deposition film.

According to the configuration, since the second emission layer is configured by a deposition film, emission life duration may be improved in comparison with a first emission layer configured by a coating film.

Application Example 3

In the organic EL device according to the application example, it is preferable that the first emission layer be a layer emitting at least one of red and green lights and the second emission layer be a layer emitting blue light.

According to the configuration, since a second emission layer of the deposition film is a blue emission layer, emission life duration of a second emission layer (blue) may be improved in comparison with a first emission layer (red or green) which is a coating film.

Application Example 4

In the organic EL device according to the application example, it is preferable that a transistor controlling light emission of the second emission layer be provided between the substrate and the partition, and the second electrode and the transistor be electrically connected to each other by at least two step contact holes.

According to the configuration, since the second electrode which is provided on the partition is connected to a transistor through two step contact holes, they may be formed easily and efficiently in comparison with a case where they are directly connected with one contact hole.

Application Example 5

In the organic EL device according to the application example, it is preferable that the partition be provided at a region overlapping a region including a driving circuit on the substrate, a wire connected with the driving circuit and a capacitor in a planar fashion.

According to the configuration, since a partition is provided overlapping a region including a TFT, a wire, and a capacitor in a planar fashion, and there is a small unevenness at a region overlapping an opening portion of the partition in the planar fashion without the wire, a thickness of a coating film provided at the opening portion may substantially uniformly be formed. Since a deposition film is provided on the partition although there is an unevenness due to the influence of a TFT or a wire, a thickness of the deposition film may be substantially uniformly formed. As a result, an organic EL device may efficiently emit light overall.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the embodiments of the present invention will be described below with reference to the accompanying drawings. Described parts may be expressed to be enlarged or reduced such that they become a recognizable state. Further, in this embodiment, an organic EL device of a top emission structure will be described by way of example.

Configuration of Organic EL Device

Figure 1:
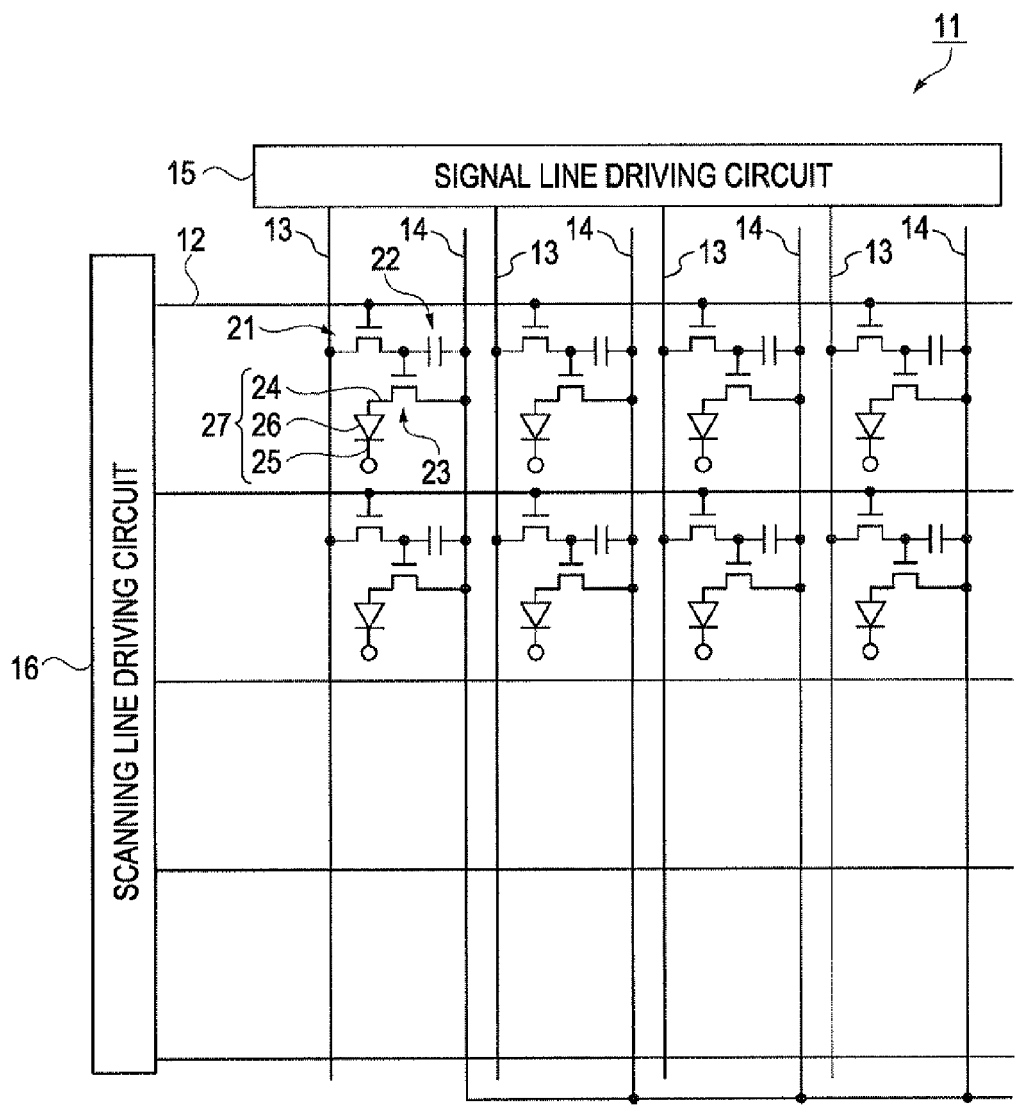
FIG. 1 is an equivalent circuit diagram illustrating an electric configuration of an organic EL device.

FIG. 1 is an equivalent circuit diagram illustrating an electric configuration of an organic EL device. Hereinafter, a configuration of the organic EL device will be described with reference to FIG. 1.

As illustrated in FIG. 1, the organic EL device 11 includes a plurality of scan lines 12, a plurality of signal lines 13 extending in a direction crossing the scan lines 12, and a plurality of power lines 14 extending parallel with the signal lines 13. Further, regions compartmented by the scan lines 12 and the signal lines 13 are configured as pixel regions, respectively. The signal lines 13 are connected to a signal line driving circuit 15. Furthermore, the scan lines 12 are connected to a scanning line driving circuit 16.

In each pixel region, a switching Thin Film Transistor (TFT) 21 in which a scan signal is supplied to a gate electrode through the scan lines 12, a maintenance capacitance unit 22 (capacitor) maintaining a pixel signal supplied from the signal line 13 through the switching TFT 21, and a driving TFT 23 (driving circuit) in which the pixel signal maintained by the maintenance capacitor 22 is supplied to a gate electrode are provided. Furthermore, in each pixel region, an anode 24 to which a driving current flows from the power line 14 when it is electrically connected with the power lines 14 through the driving TFT 23, a cathode 25 as a third electrode, and a function layer 26 inserted between the anode 24 and the cathode 25 are provided.

The organic EL device 11 includes a plurality of light-emitting elements 27, each including an anode 24, a cathode 25, and a function layer 26. The organic EL device 11 has a display region configured by a plurality of light-emitting elements 27.

According to the configuration, if the scan lines 12 are driven to turn-on the switching TFT 21, an electric potential of the signal lines 13 at this time is maintained in the maintenance capacitor 22, and the on/off state of the driving TFT 23 is determined according to a state of the maintenance capacitor 22. In addition, an electric current flows from the power lines 14 to the anode 24 through a channel of the driving TFT 23, and an electric current flows to the cathode 25 through the function layer 26. The function layer 26 emits light with luminance according to a current amount flowing therethrough.

Figure 2:
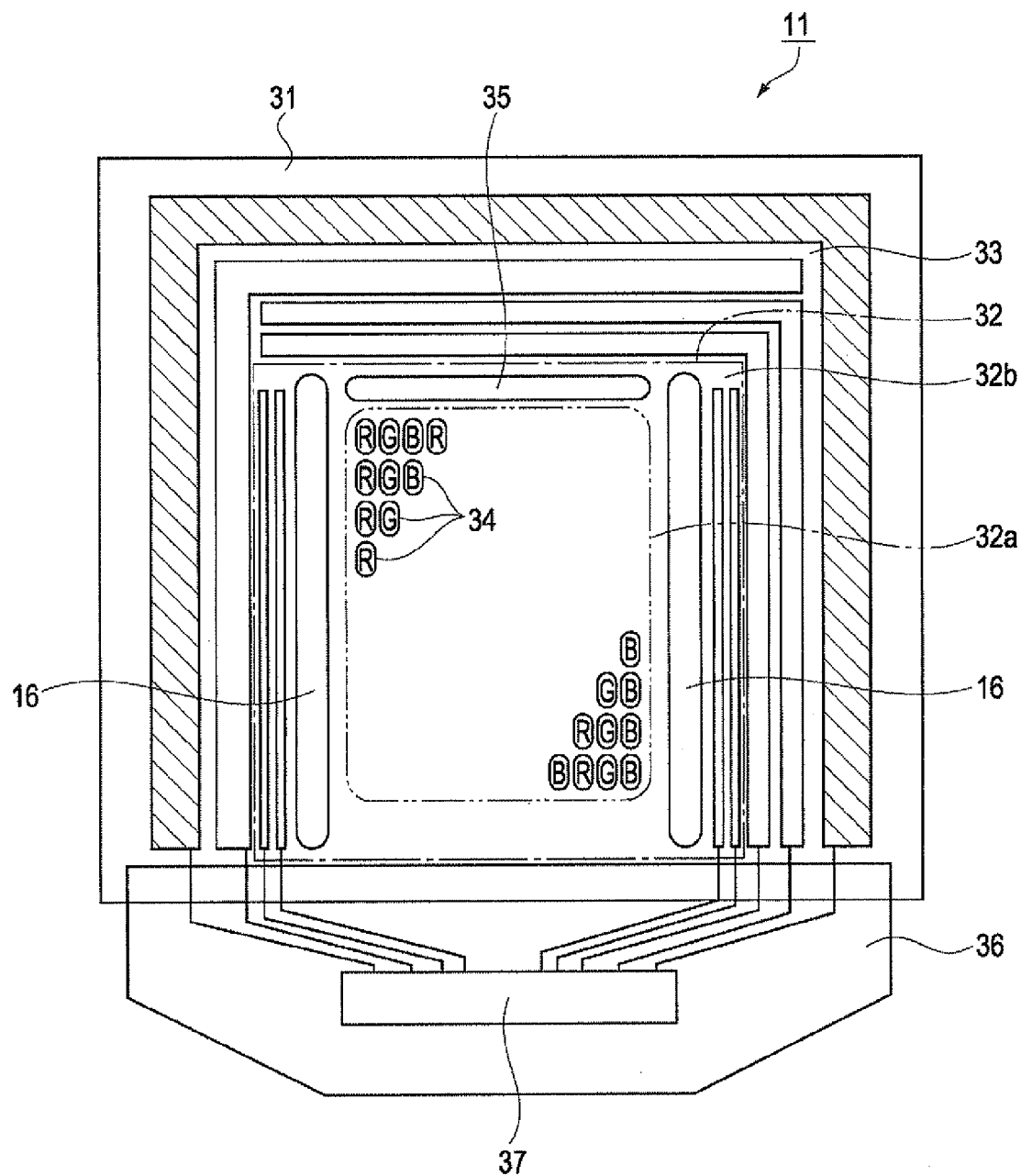
FIG. 2 is a plan view schematically illustrating a configuration of an organic EL device.

FIG. 2 is a plan view schematically illustrating a configuration of an organic EL device. Hereinafter, a configuration of the organic EL device will be described with reference to FIG. 2.

As illustrated in FIG. 2, the organic EL device 11 includes a display region 32 (inner region of dashed line in FIG. 2) and a non-display region 33 (outer region of dashed line in FIG. 2) formed on a substrate 31 made of a glass and the like. An actual display region 32a (inner region of chain double-dashed line in FIG. 2) and a dummy region 32b (outer region of chain double-dashed line in FIG. 2) are established in the display region 32.

Sub-pixels 34 (emission region) from which light is injected are arranged in a matrix pattern in the actual display region 32a. Each of the sub-pixels 34 emits each color red (R), green (G), and blue (B) lights according to operations of the switching TFT 21 and the driving TFT 23 (refer to FIG. 1).

A circuit for emitting each of sub-pixels 34 is chiefly provided in the dummy region 32b. For example, a scanning line driving circuit 16 is disposed along a left side and a right side of the actual display region 32a in FIG. 2, and a testing circuit 35 is disposed along the top of the actual display region 32a.

A flexible substrate 36 is provided at a lower side of the substrate 31. A driving IC 37 connecting with each wire is provided at the flexible substrate 36.

Figure 3:
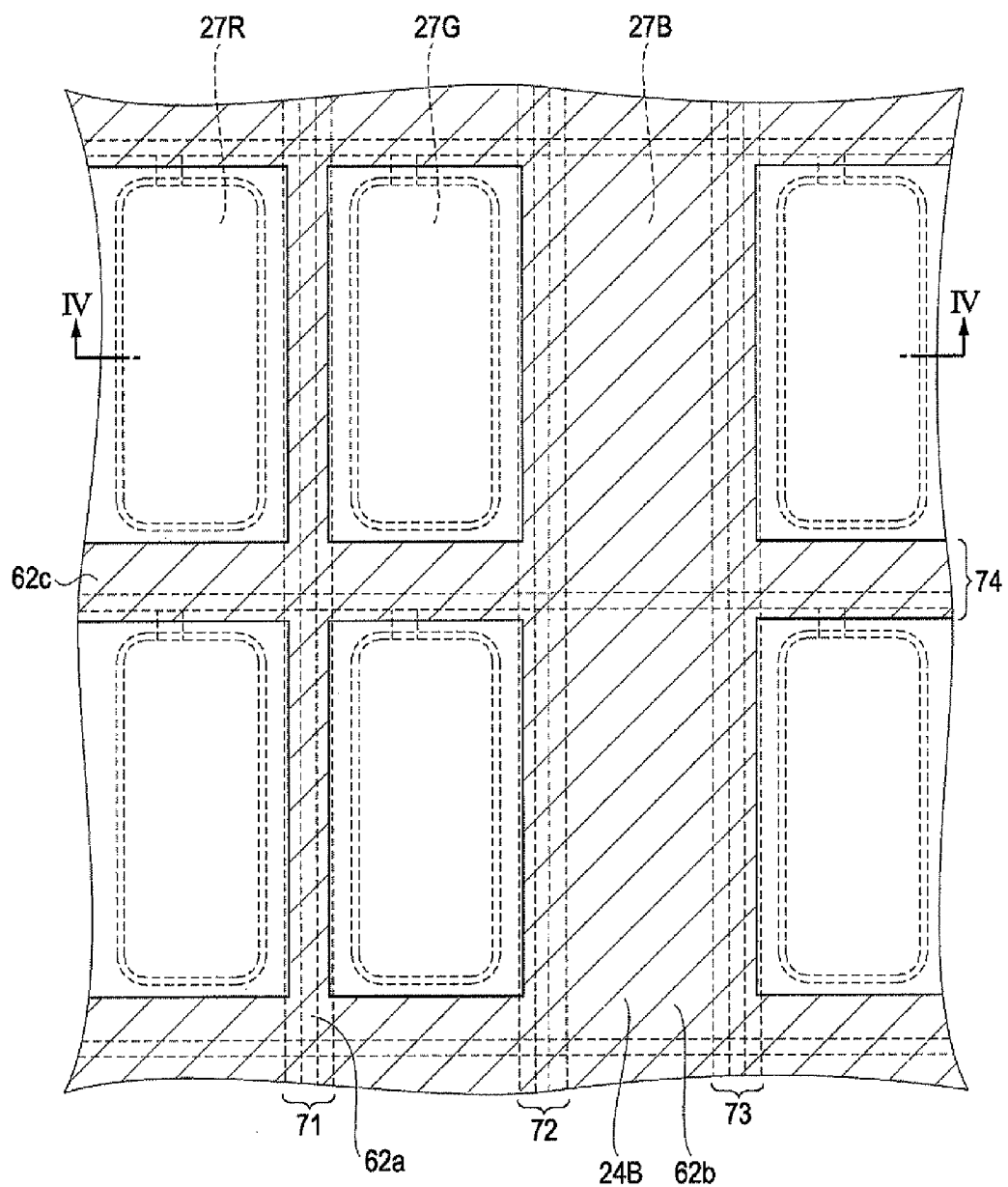
FIG. 3 is a plan view schematically illustrating a structure of a display region (actual display region) of an organic EL device.
Figure 4:
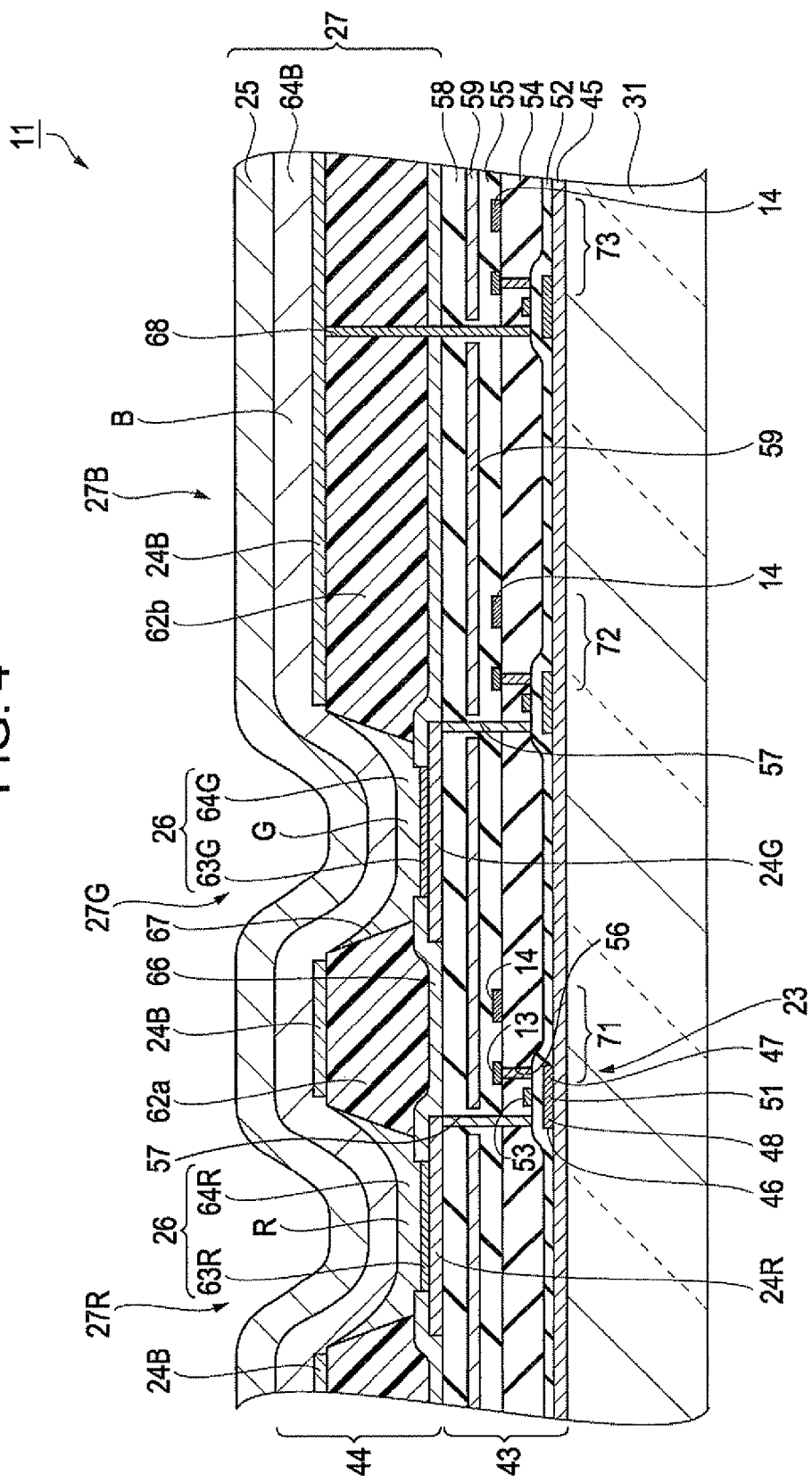
FIG. 4 is a cross-sectional schematic view taken along line IV-IV of FIG. 3.

FIG. 3 is a plan view schematically illustrating a structure of a display region (actual display region) of an organic EL device. FIG. 4 is a cross-sectional schematic view of an organic EL device taken along line IV-IV of FIG. 3. Hereinafter, a structure of the organic EL device will be described with reference to FIG. 3 and FIG. 4. Further, FIG. 3 and FIG. 4 illustrate location relationship between respective structural elements, which are expressed in a designable size.

First, as illustrated in a cross-sectional view of FIG. 4, the organic EL device 11 includes a substrate 31, a circuit element layer 43 formed on the substrate 31, a light-emitting element layer 44 formed on the circuit element layer 43, a cathode (common electrode) 25 formed on the light-emitting element layer 44. There is a glass substrate having translucency as an example of the substrate 31.

In the circuit element layer 43, a base passivation film 45 made of an oxide silicon film ($SiO_2$) is formed on the substrate 31, and a driving TFT 23 is formed on the protective undercoat film 45. In detail, a semiconductor film 46 of an island shape configured by a poly silicon film is formed on the protective undercoat film 45 is provided. In the semiconductor film 46, a source region 47 and a drain region 48 are formed by introduction of impurities. Further, parts to which impurities are not introduced become channel regions 51.

Furthermore, in the circuit element layer 43, a transparent gate insulation film 52 configured by a silicon oxide film or the like covering the protective undercoat layer 45 and the semiconductor layer 46 is formed. A gate electrode 53 (scan line) made from aluminum (Al), molybdenum (Mo), tantalum (Ta), titanium (Ti), tungsten (W) or the like is formed on the gate insulation film 52.

A first interlayer insulation film 54 and a second interlayer insulation film 55 are formed on the gate insulation film 52 and the gate electrode 53. For example, the first interlayer insulation film 54 and the second interlayer insulation film 55 may be configured by a silicon oxide film ($SiO_2$), a titanium oxide film ($TiO_2$) or the like. The gate electrode 53 is provided at a location corresponding to a channel region 51 of the semiconductor film 46.

A reflection layer 59 for irradiating light emitted from emission layers 64 (64R, 64G, and 64B) to a cathode 25 side is formed on the second interlayer insulation film 55. A transparent third interlayer insulation film 58 is formed on the reflection layer 59.

The source region 47 of the semiconductor film 46 is electrically connected with a signal line 13 formed on the first interlayer insulation film 54 via a contact hole 56 formed penetrating the gate insulation film 52 and the first interlayer insulation film 54.

A light-emitting element layer 44 has a red light-emitting element 27R emitting red (R) light, a green light-emitting element 27G emitting green (G) light, a blue light-emitting element 27B emitting blue (B) light, and banks 62 (62a, 62b, 62c) as a partition.

A drain region 48 in the red light-emitting element 27R and a green light-emitting element 27G is electrically connected to a first cathode 24R or a second cathode 24G as a first electrode provided on a third interlayer insulation film 58 through a contact hole 57 formed penetrating a gate insulation film 52, a first interlayer insulation film 54, a second interlayer insulation film 55, a reflection layer 59, and a third interlayer insulation film 58.

Meanwhile, a drain region 48 in the blue light-emitting element 27B is electrically connected to a third electrode 24B as a second electrode provided on a second band 62b via a contact hole 68 formed penetrating a gate insulation film 52, a first interlayer insulation film 54, a second interlayer insulation film 55, a reflection layer 59, a third interlayer insulation film 58, an insulation layer 66, and a second bank 62b.

The red light-emitting element 27R includes a first anode 24R patterned by a deposition film, a first hole injection layer 63R of a coating film, and a red emission layer 64R as a first emission layer of the coating film. In the same manner, the green light-emitting element 27G includes a second anode 24G patterned by a deposition film, a second hole injection layer 63G of a coating film, and a green emission layer 64G as a first emission layer of the coating film. The blue light-emitting element 27B includes a third anode 24B patterned on the banks 62 (first bank 62a, second bank 62b, third bank 62c) by a deposition film, and a blue emission layer 64B as a second emission layer being a deposition film deposited on an entire surface of the substrate 31. A cathode 25 having a polarity different from that of a first anode 24R, a second anode 24G, and a third anode 24B is provided to cover all the films. The first anode 24R to the third anode 24B are formed by a transparent Indium Tin Oxide (ITO) film.

The banks 62 (62a, 62b, 62c) are provided in an approximate lattice pattern overlapping a region including scan lines 12, signal lines 13, power line 14, driving TFTs 23 installed on a circuit element layer 43 in a planar fashion. Wires thereof are installed spaced apart from each other by a constant distance.

Specifically, for example, as illustrated in FIG. 4, in a region overlapping a first wire group 71 including signal lines 13 or power lines 14 in a planar fashion, a first bank 62a is provided. A second bank 62b is provided at a region overlapping a region extending widely from a second wire group 72 to a third wire group 73 in a planar fashion. Further, a third bank 62c is provided at a region overlapping a fourth wire group 74 (refer to FIG. 3) such as scan lines 12 and the like in a planar fashion.

A first anode 24R, a first hole injection layer 63R, and a red emission layer 64R are provided at a region surrounded by the first bank 62a, the second bank 62b, and the third bank 62c in the red light-emitting element 27R. In the same manner, a second anode 24G, a second hole injection layer 63G, and a green emission layer 64G are provided at a region surrounded by the first bank 62a, the second bank 62b, and the third bank 62c in the green light-emitting element 27G. That is, regions surrounded by the banks 62 in the red light-emitting element 27R and the green light-emitting element 27G become emission regions, respectively.

A third anode 24B is provided on a first bank 62a, a second bank 62b, and a third bank 62c in the blue light-emitting element 27S. Further, a blue emission layer 64B (including hole injection layer and the like) and a cathode 25 are formed across the entire surface of the substrate 31 (beta film formation). That is, parts except for emission regions of the red light-emitting element 27R and the green light-emitting element 27G become emission regions in the blue light-emitting element 27B.

Accordingly, as in the related art, when comparing with a case where only a region surrounded by the banks 62 becomes an emission region, an area of a blue emission region may be increased. Through this, luminance of blue emission may be deteriorated by an increased area, thereby improving life duration of the blue light-emitting element 27B.

An insulation layer 66 is formed between the circuit element layer 43 and the banks 62 (62a, 62b, 62c). There is an inorganic material such as a silicon oxide film ($SiO_2$) as an example of the insulation layer 66. The insulation layer 66 is used to secure insulation between neighboring anodes 24 (24R, 24G) and to secure lyophilization, and is formed to be positioned on a peripheral portion of the anodes 24 (24R, 24G).

For example, the banks 62 (62a, 62b, 62c) has a trapezoid shape with a slope surface when viewing a cross-section. For example, there is an organic material such as an acryl resin or a polyimide resin having heat resistance and solvent resistance as a material of the banks 62.

Further, a maintenance capacitor and a switching transistor (not shown) are formed in the circuit element layer 43. Also, as illustrated above, a driving transistor (driving TFT 23) connected to each anode 24 (24R, 24G, 24B) is formed in the circuit element layer 43.

The hole injection layers 63R and 63G are configured by a conductive high molecule layer containing dopant among conductive high molecule materials. For example, the hole injection layer 63 may be configured by 3,4-polyethylenedioxythiophene (PEDOT-PSS) containing polystyrene sulfonate as the dopant.

The emission layer 64 is formed on the hole injection layer 63, which is a layer of an organic light emitting material expressing an electroluminescence phenomenon.

For example, the cathode 25 is configured by laminating a lithium fluorite (LiF) layer, a calcium (Ca) layer, and an aluminum (Al) layer, or by a magnesium-silver (MgAg) alloy.

A sealing member and a sealing substrate (not shown) formed by resin are laminated on the cathode 25 to prevent penetration of water or oxygen. The light-emitting element 27 is configured by an anode 24, an emission layer (including hole injection layer) and a cathode 25.

A voltage is applied to each of the foregoing emission layers 64 between the anode 24 and the cathode 25 to inject holes from the hole injection layer 63 and electrons from the cathode 25. In the emission layer 64, they are combined to emit light. Hereinafter, a method of manufacturing an organic EL device 11 will be described.

Method of Manufacturing Organic EL Device

Figure 5:
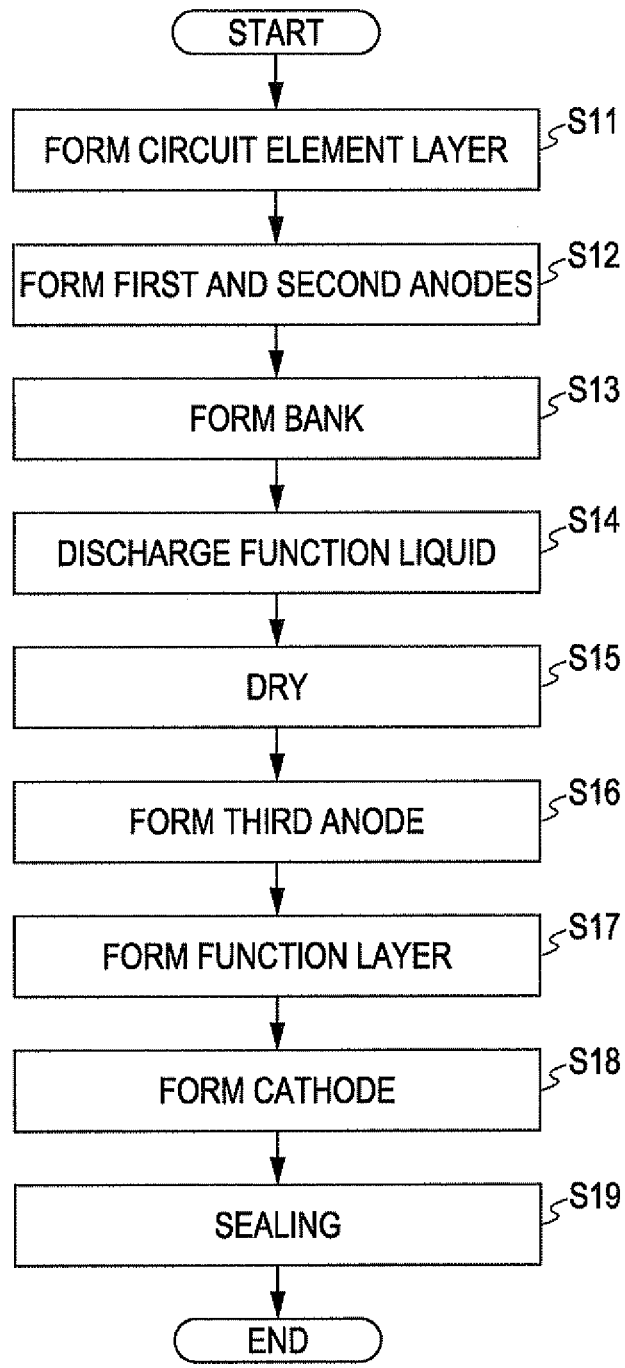
FIG. 5 is a process chart illustrating a method of manufacturing an organic EL device.

FIG. 5 is a process chart illustrating a method of manufacturing an organic EL device. FIGS. 6A to 6E are cross-sectional schematic views illustrating a partial process of a method of manufacturing an organic EL device. Hereinafter, a method of manufacturing an organic EL device will be described with reference to FIG. 5 and FIGS. 6A to 6E. The circuit element layer 43 and the like are not shown in FIGS. 6A to 6E.

First, in step S11, a circuit element layer 43 is formed on a substrate 31 using a film formation technology (refer to FIG. 4). Specifically, a driving TFT 23, a scan line 12, or a signal line 13 is formed on the substrate 31.

Figure 6A:
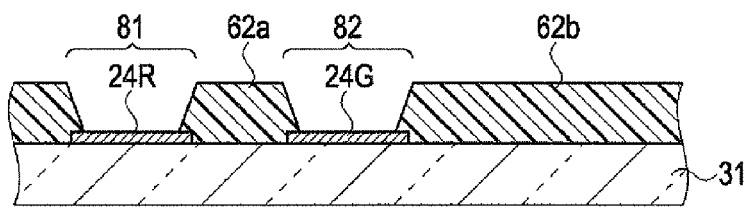
FIGS. 6A to 6E are cross-sectional schematic views illustrating a partial process of a method of manufacturing an organic EL device.

In step S12, as illustrated in FIG. 6A, a first anode 24R and a second anode 24G configured by an ITO are formed in a first light-emitting element region 81 and a second light-emitting element region 82 on the substrate 31 (third interlayer insulation film 58) using a deposition method and the like.

In step S13, banks 62 (first bank 62a, second bank 62b, third bank 62c) is formed at peripheral portions of the first anode 24R and the second anode 24G. Specifically, firstly, a film of an organic material being a material of the banks 62 is formed to cover an upper part of the substrate 31, for example, by a coating method. Next, parts corresponding to a first light-emitting element region 81 and a second light-emitting element region 82 of the organic material are eliminated using a photolithography technology and an etching technology. This completes the banks 62a and 62b as illustrated in FIG. 6A. There is a polyimide or acryl as an example of the organic material. For example, the height of the banks 62 is 2 μm.

Figure 6B:
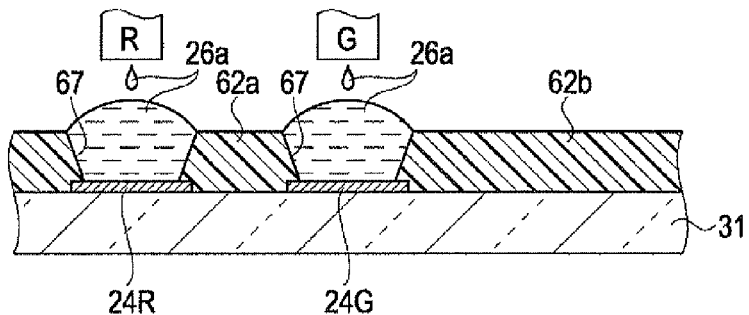

In step S14, a function liquid 26a is discharged to an opening portion 67 of the banks 62. Specifically, first, the substrate 31 on which the banks 62 is formed is washed. Next, as illustrated in FIG. 6B, a liquid droplet of the function liquid 26a is discharged toward a concave portion using the first anode 24R and the second anode 24G as a bottom and using the banks 62 as a sidewall through a liquid droplet discharge method (e.g., ink-jet method).

Figure 6C:
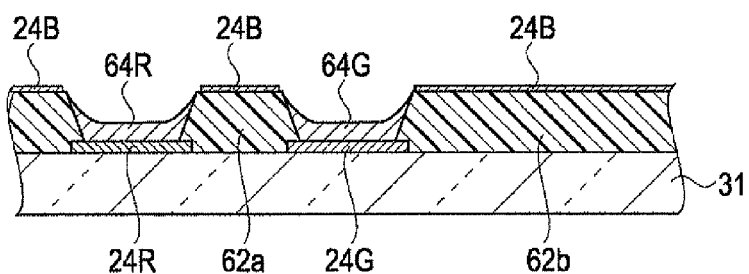

In step S15, as illustrated in FIG. 6C, the function liquid 26a is dried to form hole injection layers 63R and 63G (refer to FIG. 4) or emission layers 64R and 64G. In detail, the function liquid 26a is dried under high-temperature environment or reduced pressure to evaporate solidify solvent. This causes hole injection layers 63R and 63G or emission layers 64R and 64G to be formed in the opening portion 67.

Figure 6D:
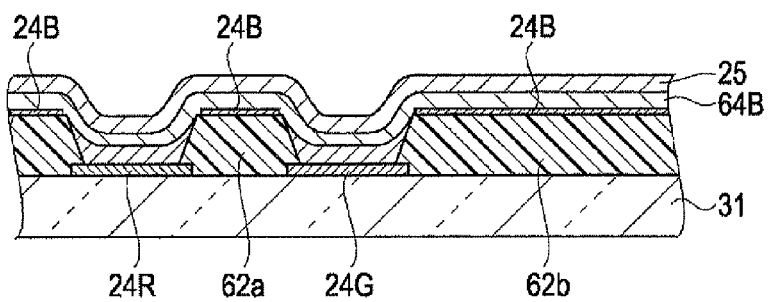

In step S16, as illustrated in FIG. 6C, a third anode 24B is formed on the banks 62 (first bank 62a, second bank 62b, third bank 62c) using a deposition method and the like. In step S17, as illustrated in FIG. 6D, a blue emission layer 64B is formed at an approximately entire upper part on the substrate 31 using a deposition method and the like.

In step S18, for example, a calcium film and an aluminum film are sequentially laminated at an approximately entire part on the substrate 31 by for example, a deposition method to form a cathode 25.

Figure 6E:
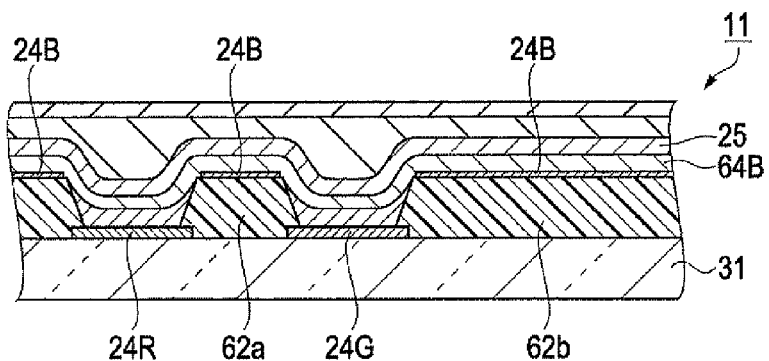

In step S19, for example, as illustrated in FIG. 6E, sealing is performed on the cathode 25 using an adhesive and a glass substrate. In doing so, the organic EL device 11 is completed.

In addition, the foregoing organic EL device 11 may be used for various electronic devices such as televisions, portable phones, displays, mobile computers, digital cameras, digital video cameras, in-car devices, audio devices, lighting equipment, light source of optical printers and the like.

As illustrated above, according to the organic EL device 11 of this embodiment, the following effects may be obtained.

(1) In accordance with the organic EL device 11 of this embodiment, a third anode 24B, a blue emission layer 64B, and a cathode 25 are provided on the banks 62a, 62b, and 62c. Accordingly, an emission area may be increased in this embodiment in which regions other than an opening portion may emit light, as compared with the related art in which only a region of an opening portion of almost the same area surrounded by a bank emits light. Accordingly, luminance for a unit area of blue may be reduced in comparison with the related art corresponding to the amount by which the emission area increased, so that the life duration of the blue emission layer 64B may be improved as compared with the related art.

(2) In accordance with the organic EL device 11 of this embodiment, a blue emission layer 64B is formed using a deposition method, and a red emission layer 64R and a green emission layer 64G are formed using a coating method. Accordingly, the life duration of the blue emission layer 64B may be increased in comparison with a case where a blue emission layer is formed using a coating method. In addition, since emission layers (red emission layer 64R, green emission layer 64G) except for the blue emission layer 64B are formed using the coating method, overall manufacturing efficiency may be enhanced.

(3) In the organic EL device 11 of this embodiment, since banks 62 are provided overlapping a region including a driving TFT 23, wires (scan line 12, signal line 13, power line 14), and a capacitor (maintenance capacitor 22) in a planar fashion, there is a small unevenness without wires in a region overlapping an opening portion 67 of the banks 62 in a planar fashion, the thickness of the blue emission layer 64B provided in the opening portion 67 may be substantially uniformly formed. Further, even though banks 62 has unevenness due to the influence of a driving TFT 23 or wires 12, 13, and 14 on the banks 62, because a blue emission layer 64B is formed thereon using deposition, a blue emission layer 64B may be formed at an almost uniform thickness. As a result, the entirety of organic EL device 11 may emit light efficiently.

In addition, an embodiment is not limited to the foregoing embodiment, but may be implemented by following embodiments.

Modified Example 1

Figure 7:
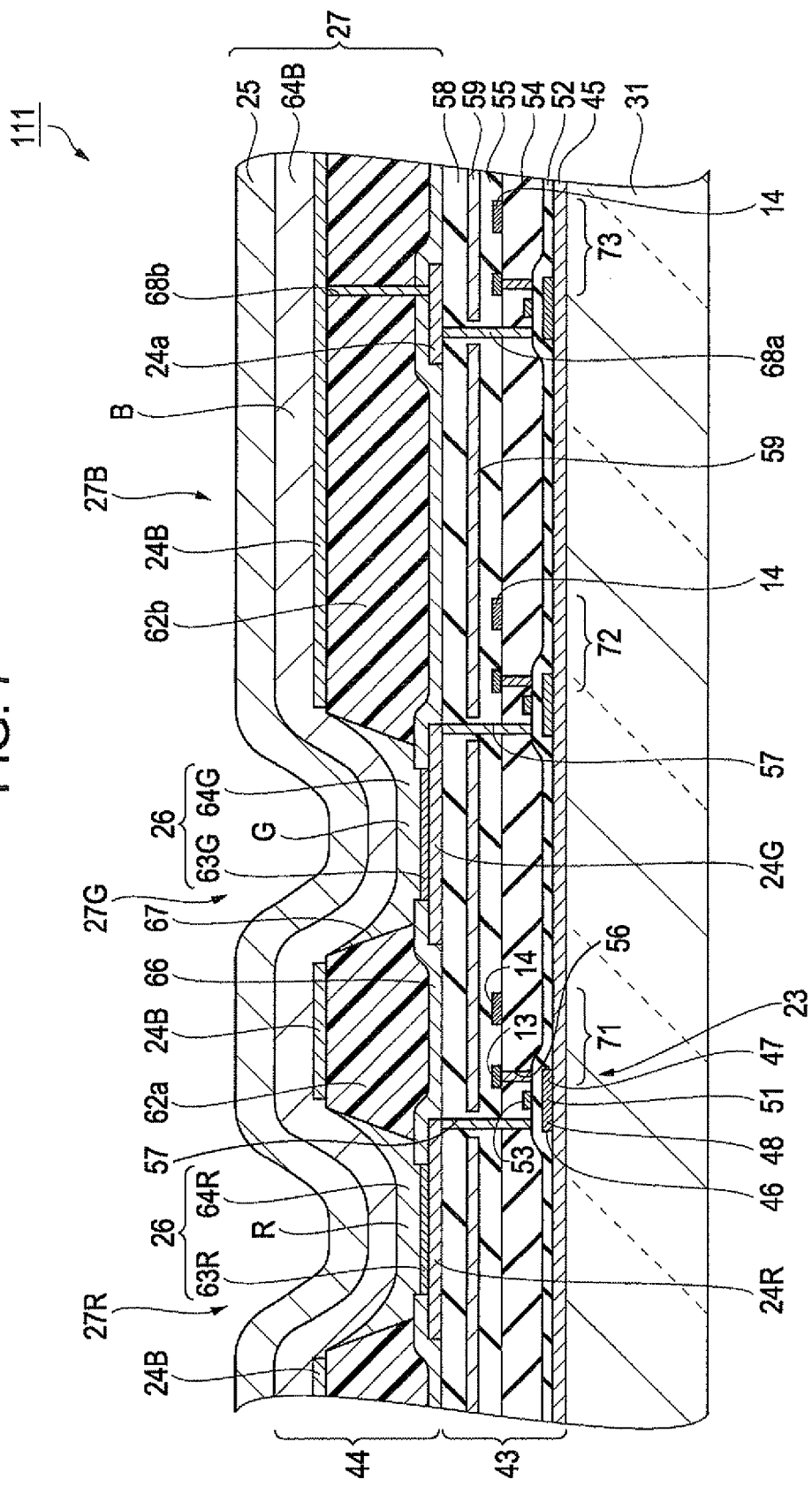
FIG. 7 is a cross-sectional schematic view illustrating a structure of an organic EL device according to a modified example.

As illustrated above, a third anode 24B and a drain region 48 of a driving TFT 23 formed on banks 62 are not limited to a case where they are electrically connected to each other through one contact hole 68. However, as shown in FIG. 7, the third anode 24B and the drain region 48 of a driving TFT 23 may be electrically connected to each other through two step contact holes. FIG. 7 is a cross-sectional pattern view illustrating a structure of an organic EL device according to a modified example.

An organic EL device 111 shown in FIG. 7 electrically connects the drain region 48 with a third anode 24B using two contact holes 68a and 68b. A first contact hole 68a electrically connects a conductive film 24a provided on the same layer as those of the first anode 24R and the second anode 24G. A second contact hole 68b electrically connects the conductive film 24a with a third anode 24B provided on the second bank 62b.

As illustrated previously, because they are electrically connected using two step contact holes 68a and 68b, a taper length of a side surface produced in a contact hole may be reduced to improve electric connection (and connect certainly) in a procedure of forming the contact holes. Accordingly, the yield of a product may be improved. Further, this may prevent an aluminum material of the first contact hole 68a from being exposed. The processing may be easier in comparison with a case where they are directly connected by one contact hole 68 to improve manufacturing efficiency.

Modified Example 2

As illustrated in the foregoing embodiment, an electrode inserted in the function layer 26 is not limited to a structure in which a substrate 31 side is an anode and a sealing substrate side is a cathode. A structure (reverse structure) in which the substrate 31 side is a cathode and the sealing substrate side is an anode may also be applied.

Modified Example 3

As illustrated previously, the invention is not limited to a configuration in which signal lines 13, power lines 14, and driving TFTs 23 are disposed at regular intervals. However, for example, because a function layer 26 is planarized in red (R) and green (G) light-emitting element regions formed by a coating method, a formation region of a bank may be biased to a light-emitting element region of RGB such that they are not disposed to a lower position of a light-emitting element region. In other words, a wire or a TFT are concentrated and disposed in the lower position of a blue (B) light-emitting element region. In doing so, because the thickness of a function layer 26 formed by a coating method is approximately uniform, emission quality may be improved.

Modified Example 4

As illustrated above, an organic EL device 11 of a top emission structure has been described by way of example. However, the foregoing structure is also applicable to an organic EL device of a bottom emission structure. Further, because a region which the wires shield from light becomes larger in the bottom emission structure, the foregoing structure is preferably applied to a top emission structure.

The entire disclosure of Japanese Patent Application No. 2011-122157, filed May 31, 2011 is expressly incorporated by reference herein.

What is claimed is:

1. An organic EL device comprising:
a partition provided to surround a first electrode on a substrate;
a first emission layer provided in an opening portion of the partition;
a second electrode having the same polarity as that of the first electrode provided on the partition;
a second emission layer provided in an entire portion of the substrate including the second electrode;
a third electrode having a different polarity from those of the first electrode and the second electrode provided to cover the second emission layer; and
a transistor controlling light emission of the second emission layer provided between the substrate and the partition, wherein
the second electrode and the transistor are electrically connected to each other by at least two step contact holes.

2. The organic EL device according to claim 1, wherein the first electrode and the second electrode are an anode and the third electrode is a cathode.

3. The organic EL device according to claim 1, wherein the first emission layer is configured by a coating film, and the second emission layer is configured by a deposition film.

4. The organic EL device according to claim 1, wherein the first emission layer is a layer emitting at least one of red and green lights, and
the second emission layer is a layer emitting blue light.

5. An organic EL device comprising:
a partition provided to surround a first electrode on a substrate;
a first emission layer provided in an opening portion of the partition;
a second electrode having the same polarity as that of the first electrode provided on the partition;
a second emission layer provided in an entire portion of the substrate including the second electrode; and
a third electrode having a different polarity from those of the first electrode and the second electrode provided to cover the second emission layer, wherein
the partition is provided at a region overlapping a region including a driving circuit on the substrate, a wire connected with the driving circuit and a capacitor in a planar fashion.

6. The organic EL device according to claim 5, wherein the first electrode and the second electrode are an anode and the third electrode is a cathode.

7. The organic EL device according to claim 5, wherein the first emission layer is configured by a coating film, and the second emission layer is configured by a deposition film.

8. The organic EL device according to claim 5, wherein the first emission layer is a layer emitting at least one of red and green lights, and
the second emission layer is a layer emitting blue light.

* * * * *